United States Patent [19]

Richart et al.

[11] Patent Number: 5,581,502
[45] Date of Patent: Dec. 3, 1996

[54] METHOD FOR READING A NON-VOLATILE MEMORY ARRAY

[75] Inventors: Robert B. Richart, Austin; Nipendra J. Patel, Thorndale; Shyam G. Garg, Austin, all of Tex.

[73] Assignee: Advanced Micro Devices, Inc., Sunnyvale, Calif.

[21] Appl. No.: 432,623

[22] Filed: May 2, 1995

[51] Int. Cl.$^6$ ........................................................ G11C 7/00
[52] U.S. Cl. ............................. 365/185.26; 365/185.3; 365/185.33
[58] Field of Search .................................. 365/185, 218, 365/900, 185.01, 185.12, 185.26, 185.29, 185.3, 185.33; 437/43, 48, 52

[56] References Cited

U.S. PATENT DOCUMENTS

| | | | |
|---|---|---|---|
| 4,486,859 | 12/1984 | Hoffman | 365/185 |
| 4,958,321 | 9/1990 | Chang | 365/185 |
| 5,077,691 | 12/1991 | Haddad et al. | 365/218 |
| 5,335,198 | 8/1994 | Van Buskirk et al. | 365/185 |
| 5,371,031 | 12/1994 | Gill et al. | 437/52 |
| 5,371,706 | 12/1994 | Krentz et al. | 365/185.12 |
| 5,376,573 | 12/1994 | Richart et al. | 437/48 |

OTHER PUBLICATIONS

S. Lai et al., "Comparison and Trends in Today's Dominant E$^2$ Technologies", *Int'l Electron Devices Meeting Tech. Digest*, (1986), pp. 580–583.

*Primary Examiner*—David C. Nelms
*Assistant Examiner*—Trong Phan
*Attorney, Agent, or Firm*—Kevin L. Daffer

[57] ABSTRACT

A non-volatile memory device is provided having an array of single transistor memory cells read in accordance with an improved read cycle operation. That is, a selected cell mutually connected via a single bit line to other cells is assured activation necessary to discern a programmed or unprogrammed state of that cell. The non-selected cells connected to the selected cell are advantageously assured of non-activation by applying a negative voltage to the word lines associated with those cells. The negative voltage is less than the threshold voltage associated with the single transistor MOS device. The non-selected cells are thereby retained inactive to provide a singular active or inactive selected cell dependent solely upon the programmed state of the array. Negative voltage upon the non-selected cells provides minimal leakage of over-erased cells normally associated with depletion mode operation.

23 Claims, 3 Drawing Sheets

METHOD FOR READING A NON-VOLATILE MEMORY ARRAY

BACKGROUND OF THE INVENTION

1. Field of the Invention

This invention relates to integrated circuits and more particularly to an improved method for reading a non-volatile memory array having over-erased memory cells within the array.

1. Description of the Relevant Art

There are many types of non-volatile memory, often called read only memory (ROM) or programmable read only memory (PROM). Non-volatile memory can be formed in either bipolar or MOS technology. Most MOS PROMs are based on one of three currently available technologies (i.e., EPROM, EEPROM or flash EPROM). Non-volatile MOS EPROMs are designed to perform in numerous similar ways, and can be achieved using many well-known technologies such as: (i) floating gate tunnel oxide, (ii) textured poly, (iii) metal nitride oxide silicon (MNOS), and (iv) EPROM-tunnel oxide (ETOX). Regardless of the form chosen, it is generally recognized that stacked polysilicon conductors are used to perform the program and erase functions. A comparison of the various non-volatile PROMs technologies is described in an article to S. Lai, et al., "Comparison and Trends in Today's Dominant $E^2$ Technologies", Int'l Electron Devices Meeting Tech. Digest, (1986) pp. 580–583 (herein incorporated by reference).

A conventional MOS PROM memory array generally uses a single transistor for each cell within the array. The transistor is configured from a p–type substrate, having n-type source and drain regions provided within the substrate. In a flash EPROM device, the source is generally double-diffused. Thus, a double-diffused source region is defined to receive a n+type dopant in the same source region in which a previous n–type dopant was placed. Between the source and drain regions is a channel region, over which a tunnel oxide is formed. Placed upon the tunnel oxide is a floating polysilicon gate, and insulatively spaced over the floating polysilicon gate is a control polysilicon gate. Control polysilicon gates (control gates) are connected to respective word lines within the MOS PROM memory array. Drain regions are connected to respective bit lines within the MOS PROM array.

Using a flash EPROM cell as an example, an MOS PROM cell is typically programmed by applying a relatively high voltage to the control gate and a moderately high voltage to the drain. Hot electrons are thereby injected as a result of the electric field created between the control gate and drain. The hot electrons are injected upon the floating gate and trapped in the floating gate due to the fact that the floating gate is surrounded by dielectrics. Thus, a program operation functions to place a net negative charge upon the floating gate. Any read from a cell having programmed charge on the floating gate requires a higher read voltage on the control gate than cells which are not programmed. Higher voltage upon the programmed cell control gate is necessary to activate or ("turn-on") the single transistor MOS PROM cell. Further stated, a programmed MOS PROM cell requires a higher turn-on voltage at the control gate or (word line) than that of a unprogrammed cell.

Again using a flash EEPROM cell as a example, a programmed non-volatile MOS PROM cell is erased by extracting electron charge from the floating gate. Erasure is accomplished by electron tunneling and/or hot-hole injection. Typically, a high voltage is applied to the source of the cell while the gate is grounded. The drain is usually floating, and electron trapped upon the floating gate in a previous programming cycle are drawn (i.e., "tunneled") from the floating gate through the tunnel oxide and into the positively charged source.

The mechanism for programming and erasing a single transistor MOS PROM cell is described in reference to U.S. Pat. No. 4,958,321 (herein incorporated by reference). Described in Patent No. '321 is the program and erase description of a flash EPROM cell. It is understood, however, that program and erase of an EEPROM or UV-erased EPROM is performed or can be performed in substantially the same manner. That is, program is achieved by injection of electrons onto the floating gate, and erase is achieved by electron tunneling and/or hot-hole injection of those programmed electrons from the floating gate. Described in U.S. Pat. No. 5,077,691 are a number of drawbacks associated with flash EEPROM erase operations. Mentioned in Patent '691, is the problem of multiple power supply requirement and reverse voltage breakdown of the source during the erase operation. A double-diffused source region is typically employed to protect against the reverse voltage breakdown caused by the high positive voltage needed at the source during cell erase. Patent '691 teaches an advantage of using a highly negative voltage upon the control gate and a moderately positive voltage at the source during the erase operation. A moderately positive voltage at the source is employed to circumvent the necessity of a double diffused source needed if the source were heavily biased positive.

While Patent '691 teaches an improvement in the erase operation by utilizing a negative voltage upon the control gate, it does not suggest improvements in the read operation. That is, after a cell has been repeatedly erased under conditions of Fowler-Norheim tunneling, it may eventually acquire a somewhat positive potential. Thus, over numerous erase cycles, the floating gate will assume a condition often referred to as "bit over-erase". A description of bit over-erase is provided in reference to U.S. Pat. No. 5,335,198 (herein incorporated by reference).

Bit over-erase generally presents problems during the read operation. An understanding of over-erase problem begins by an understanding of the read operation. Namely, the read operation employs positive voltage exceeding the "turn on" threshold upon a control gate to be read, while all other control gates not to be read and associated with a mutually-connected bit line receive voltage less than a threshold amount. A cell to be read thereby utilizes a ground potential at the source region while the control gate is held at a positive potential, e.g., +5.0 volts. The drain region is generally held at a lower positive potential, e.g., between +1.0 to +4.0 volts. Under these conditions, an unprogrammed cell will conduct current of a greater amount than that of a programmed cell. Thus, the programmed state of the array can be read using this selective read operation. In an over-erased condition, an erased cell (a cell which is "non-programmed") will take on a net positive voltage upon the floating gate. The positive voltage presents itself as a negative threshold voltage. Accordingly, an over-erased cell functions essentially as a depletion-mode transistor.

It is important that only the cell of interest be read, and that all other mutually connected cells not be read. Accordingly, only the programmed/unprogrammed state of the cell of interest need be read in a read cycle. The non-selected cells, or cells not of interest, are provided 0.0 volts upon the control gate in an attempt to ensure their inoperability. Unfortunately, if the non-selected cells are depletion-mode transistors (i.e., have negative threshold voltage brought about by an over-erase condition), then the over-erased cells will, inadvertently be active causing leakage within the respective column bit line. Accordingly, an over-erased memory cell will disable an entire column of memory array. As used herein, the term "endurance" refers to the number of times a memory cell can be reprogrammed and erased with operability retained. If an over-erased condition causes inadvertent turn-on of a cell and inaccurate reading upon a column bit line, endurance of the corresponding memory cell is reduced. It is therefore important to maximize memory cell endurance by ensuring against inadvertent turn-on of over-erased cells without having to add complicated bit correction structures to the memory array. Conventional non-volatile memories employ bit correction circuitry which function to sense an over-erased cell and, as a result thereof, program back to a normal condition the over-erased memory cell. Sense and reprogram operations unduly adds complexity to the memory array and thereby reduces memory storage density.

SUMMARY OF THE INVENTION

The problems outlined above are in large part solved by an improved read operation of the present invention. That is, the read operation hereof insures the inactivity of non-selected cells within a bit line column of cells. Thus, only the cell of interest is read with minimal bit line column leakage associated with the read operation.

Memory cell read is performed using a voltage upon the nonselected control gates assured of being less than the turn on threshold of the respective over-erased cells. The applied voltage is preferably a negative voltage such that the negative voltage magnitude is more negative than the turn-on voltage of an over-erased cell, or cell behaving as a depletion-mode transistor. Accordingly, all non-selected cells receive in a read cycle negative voltage upon their respective control gates, and the cell of interest receives a positive voltage greater than the unprogrammed threshold voltage, but less than a programmed threshold voltage. For example, a control gate can receive a +5.0 volt supply at a respective word line which can activate or "turn-on" an unprogrammed single transistor cell (programmed at approximately +1.5 volts), but will not turn-on a programmed transistor (i.e., a transistor programmed at +6.0 volts). Thus, a negative control gate voltage upon all non-selected cells ensures those cells will be inactive or turned off during a gate operation regardless of the number of prior erasures of that cell.

The negative voltage placeable upon non-selected control gate cells is advantageously derived from the power supply used in providing power to the array —i.e., power to the control gate, source and drain of each transistor within the array. An additional power supply is thereby not needed and, more importantly, additional circuitry associated with conventional sensing and re-programming circuits is eliminated. Thus, the improved read methodology hereof is designed to enhance the endurance of a non-volatile MOS PROM memory array and to allow intentional overerasing for speed improvements. In some cases, a memory array is slightly over erased by design. Over-erasure allows for a lowering of the "turn-on" voltages, thereby raising saturation currents and improving access times of the resulting memory device. To allow over-erase would therefore be advantageous in many instances. An extended number of erase operations can thereby be performed upon a cell without deleteriously affecting the read operation of that cell. Further, the read operation hereof eliminates complex circuitry and thereby allows usage within a more dense array of memory elements placed upon a single monolithic substrate.

Broadly speaking, the present invention contemplates a method for reading a non-volatile memory array. The method includes the steps of providing a non-volatile memory array having a plurality of single transistor memory cells. Each memory cell includes a word line and a bit line, or multiple bit lines in the case of a virtual ground non-volatile memory device. Non-volatile memory device is therefore defined to include either a virtual ground or a non-virtual ground memory device. A positive voltage is applied to a word line of an active memory cell to be read (i.e., a memory cell of interest). A negative voltage is applied to a word line of an inactive memory cell not to be read (i.e., a memory cell not of interest). As defined herein, memory cells of interest are those cells selected for read, whereas cells not of interest are cells connected to the bit line (or lines) of a cell to be read but which are not of interest and therefor must remain inactive or turned off.

The present invention further contemplates a method for minimizing bit line leakage during a read cycle of a non-volatile memory array. The method includes the steps of providing an array of single transistor programmable read only memory cells. Each single transistor cell includes a control gate coupled to a word line and a drain coupled to a bit line. A series of drains associated with respective single transistor cells are connected to a bit line conductor. Respective control gates associated with the bit line-connected series of single transistor cells are connected to respective word line conductors. A voltage exceeding turn-on threshold is applied to one of the bit line-connected series of single transistor cells. A negative voltage less than turn-on threshold is applied to the others of the bit line-connected series of single transistor cells.

The present invention still further contemplates a method for programming, erasing and reading a bit within an array of single transistor programmable read only memory cells. The method comprises the steps of providing a single transistor read only memory cell. The read only memory cell includes a channel region arranged between a source and drain, wherein the source and drain may be virtual as in the case of virtual ground non-volatile memories. The memory cell further includes a floating gate insulatively spaced between the channel region and control gate. A word line is connected to the control gate and a bit line is connected to the drain. A negative charge is programmed upon the floating gate by applying a first positive voltage to the control gate and a second positive voltage to the drain. The second positive voltage is less than the first positive voltage. A negative charge upon the floating gate is erased by applying a first negative or ground voltage to the control gate and a third positive voltage upon the source. The programming and erasing steps are repeated over time eventually causing net positive charge upon the floating gate. The unselected single transistor read only memory cells are inactive during reading of the bit line voltage of the respective drain. The inactive single transistor is accomplished by applying a negative voltage to the respective control gate, whereby the negative voltage is chosen as a negative voltage magnitude never to allow inversion of the channel region insulatively spaced beneath a net positively charged floating gate.

The present invention still further contemplates memory array cells which are intentionally over-erased. The over-erased cells are read using the technique hereof. The over-erased cells are provided in order that the access speed or access time of the memory array be improved. That is, the present invention ensures accurate read operations with over-erased cells of depletion mode transistors, while the large read currents of those cells would improve their access times.

BRIEF DESCRIPTION OF THE DRAWINGS

Other objects and advantages of the invention will become apparent upon reading the following detailed description and upon reference to the accompanying drawings in which.

Figure 1:
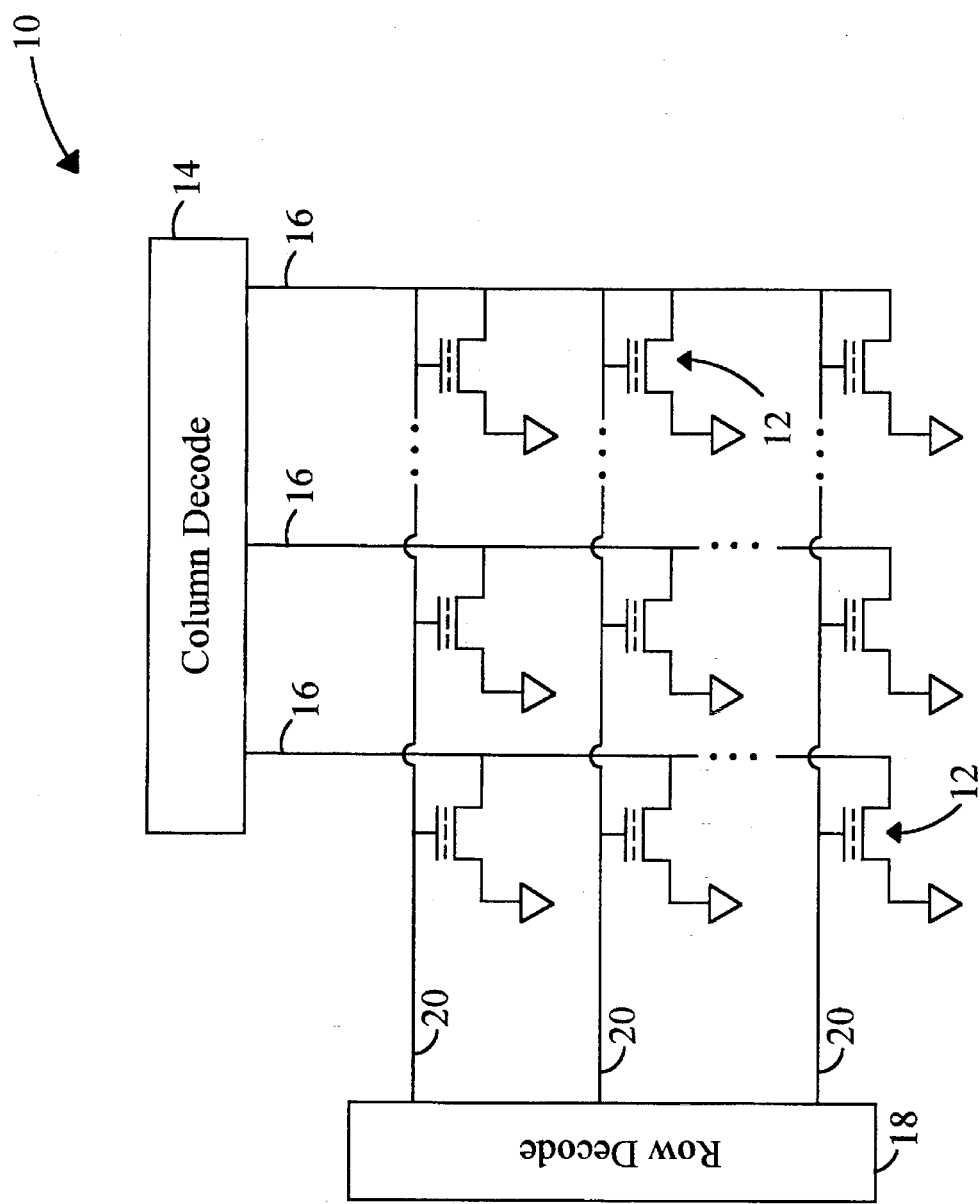
FIG. 1 is a circuit schematic diagram of a partial exemplary non-volatile memory array having single transistor memory cells, wherein the memory cells can be arranged as virtual ground memory cells.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a circuit schematic of a partial non-volatile memory device 10. Memory device 10 is an MOS programmable read only memory (PROM) device. Device 10 includes an EPROM, EEPROM or flash EPROM device in either non-virtual ground or virtual ground configuration. Device 10 is shown having a plurality of single transistor memory cells 12 coupled within an array of cells. Each memory cell 12 includes an n– type impurity implant region formed within the p– type substrate. The n– type impurity regions are source and drain regions spaced apart by a channel region. Overlying at least a portion of the channel region is a thin tunnel oxide (generally less than 100 Angstroms). Placed upon the tunnel oxide is a floating gate, and insulatively placed over the floating gate is a control gate.

Shown in FIG. 1 is a column decode device 14 of well-known design coupled to bit lines 16. Also shown in FIG. 1 is a row decode device of well-known design coupled to a plurality of word lines 20. Each word line is coupled to a row of control gates associated with corresponding transistors of single transistor cells 12, and each bit line is connected to corresponding drain regions associated with transistors of single transistor memory cells 12. The source region is typically grounded during a program or read cycle (but not during an erase cycle).

Figure 2:
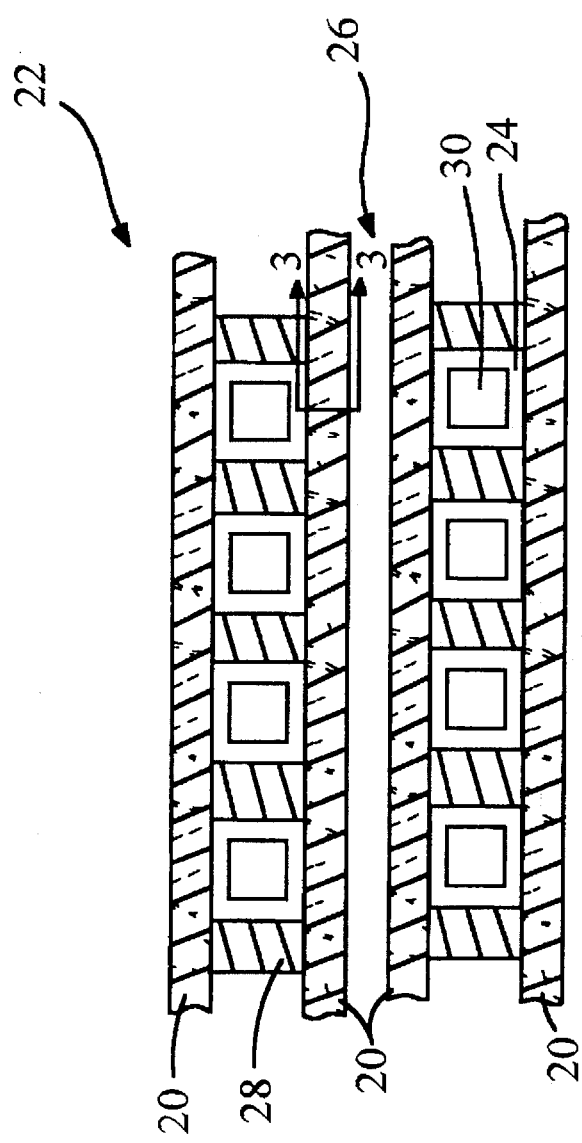
FIG. 2 is a top layout view of an exemplary partial non-volatile memory array.

Turning now to FIG. 2, a top layout view 22 is shown of a partial exemplary non-volatile memory device 10. Layout 22 depicts four of possibly many word lines 20 extending across an array of memory cells. Underlying word line 20, and spaced a distance from each other, are floating gates arranged over the channel region between drain region 24 and common source region 26. Strips of field oxide 28, severed at the edges of pairs of word lines 20, function to isolate a bit (a bit within a column bit line 16 from an adjacent bit within another column of bit line 16). Field oxide 28 can therefore be formed using a self-aligned process set forth in U.S. Pat. No. 5,120,671 (herein incorporated by reference). Removal of field oxide in the source region results in a common source region extending throughout the array. Sufficient positive charge upon the common source thereby allows flash erasure of the array of memory cells. A metallization layer is formed above the field oxide and is insulatively spaced over word lines 20 in electrical connection with contact regions 30 of corresponding drains 24. The metallization layer is not shown for sake of brevity and clarity, however, it is understood that metallization strips are formed substantially orthogonal to word line strips 20 to, comprise bit lines 16 extending from a series of contacts 30 to column decode device 14.

Figure 3:
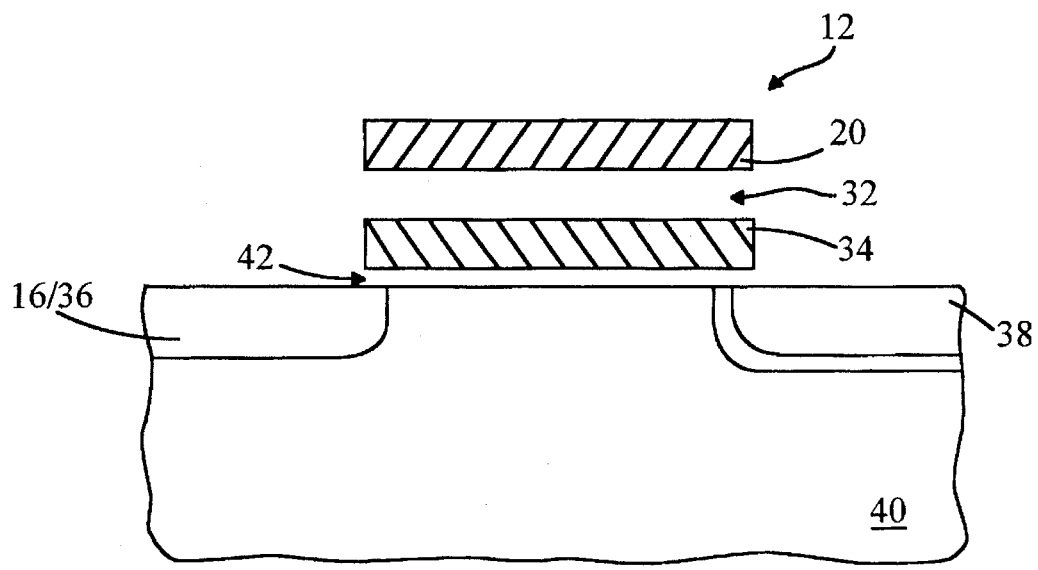
FIG. 3 is a cross-sectional view of a single transistor memory cell which can be read according to voltage levels of the present invention.

Referring now to FIG. 3, a cross-sectional view along plane 3—3 of FIG. 2 is shown. Specifically, FIG. 3 illustrates a single transistor memory cell 12 (absent contacts, interlevel dielectrics and overlying metallization) in cross-section. Memory cell 12, shown in the exemplary form of FIG. 3, comprises a stacked pair of polysilicon conductors. The stacked polysilicon conductors are insulatively spaced above a semiconductor substrate having source and drain regions formed therein. Specifically, the stacked polysilicon pair comprises a control polysilicon gate (extending as word line 20) upon a dielectric 32, wherein dielectric 32 is interposed between control gate/word line 20 and underlying floating gate 34. As described above, floating gate 34 is programmed via an electric field with electrons placed thereon, and is erased via an electric field by withdrawal of those electrons therefrom. Program and erase operations are carried forth by application of various voltage potentials upon control gate 20, drain 36, source 38 and substrate 40. Formed between floating gate 34 and a channel separating source/drain 38/36 is a tunnel oxide 42. Shown in the exemplary embodiment of FIG. 3 is a double-diffused source 38 having an n– type impurity implant surrounding an n+ type impurity implant, wherein both implants are formed within a p– type substrate 40. Instead of double-diffusing source 38, it is understood, however, that a single-diffused source 38 can be employed instead.

Depending upon whether cell 12 is a cell selected for read, dissimilar voltages are placed upon control gate 20 (word line). The voltage level chosen is deemed necessary to read the program state of floating gate 34 at bit line 16 coupled to drain 36. If, for example, cell 12 shown in FIG. 3 is a selected cell (cell of interest), then that cell is read by application of a voltage exceeding threshold upon control gate/word line 20. Bit line 16 of associated drain 36 is coupled to a somewhat lesser positive voltage (e.g., +1.0 volts to +4.0 volts), and source 38 is maintained at ground potential. In most applications, read of a selected bit line is carried out by applying a substantially high voltage of approximately +5.0 volts to control gate word line 20. All non-selected cells having mutually connected drain regions 36 (drains connected to a singular bit line 16) are maintained in an inactive (turned-off state) by applying a negative voltage to control gate (each word line 20 throughout the array). A negative voltage assures that any over-erased cells (i.e., cells having transistors which are depletion mode transistors) not being selected will not turn-on regardless of the number of program and erase operations occuring previous to the read operation.

Figure 4:
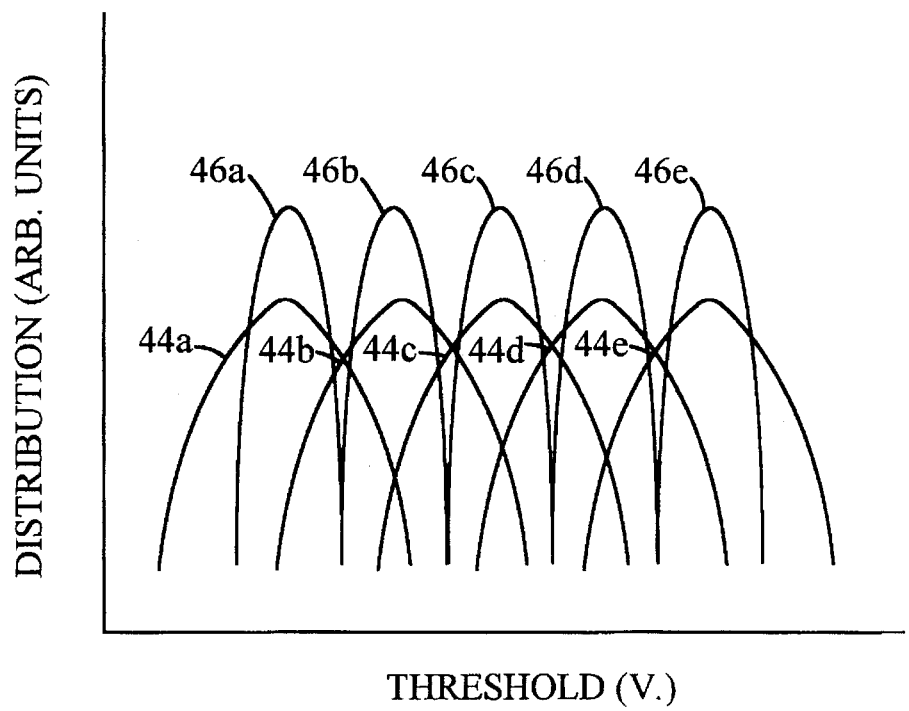
FIG. 4 is a graph illustrating threshold voltage distribution of memory cells read in accordance with a memory read operation of the present invention.

Turning now to FIG. 4, a graph is provided of threshold voltage distribution associated with a read operation. More specifically, FIG. 4 illustrates threshold voltage skews, shown by curves 44a–44e of a plurality of memory cells within an array of memory cells (or memory device). While one memory cell which is unprogrammed might have a higher turn-on voltage than another, it is essential that all memory cells within a memory device not be turned on if they are not selected for turn-on. That is, unprogrammed memory cells throughout the array of cells must be assured of non turn-on by choosing a threshold voltage less than the turn-on voltage of the most "over-erased" cell. Shown in the example of FIG. 4, the most over-erased groups of cell is that depicted in curve 44a. The reason for the curvature and distribution associated therewith is the threshold may vary over time and may be susceptible to process fluctuations. Thus, a voltage must be chosen which accounts for process variations and threshold skews. It is determined that a negative voltage, a suitable negative voltage being −0.1 volts is needed to ensure that regardless of process skews, wafer runs variability, etc., non-selected cells will not turn-on causing deleterious column leakage in the mutually connected bit line.

FIG. 4 further illustrates process skews of cells having tighter turn-on threshold, as represented by curves 46a–46e in relation to curves 44a–44e. Unprogrammed transistors may be substantially over-erased or, in the alternative, not be substantially over-erased. In either instance, it is important to pick a read voltage on the non-selected memory cells which will account for such variations.

It will be appreciated by those skilled in the art having the benefit of this disclosure that this invention is believed to be capable of applications with numerous types of non-volatile memory devices including EPROM, flash EPROM, and/or EEPROM devices in non-virtual ground or virtual ground configurations. Furthermore, it is also to be understood that the form of the invention shown and described is to be taken as a presently preferred embodiment. Various modifications and changes may be made without departing from the spirit and scope of the invention as set forth in the claims. It is intended that the following claims be interpreted to embrace all such modifications and changes, and accordingly, the specification and drawings are to be regarded in an illustrative rather than a restrictive sense.

What is claimed is:

1. A method for reading a non-volatile memory array comprising:

providing a non-volatile memory array having a plurality of single transistor memory cells, each memory cell having a word line and a bit line;

applying a positive voltage to a word line of an active memory cell to be read; and applying a negative voltage to a word line of an inactive memory cell not to be read.

2. The method as recited in claim 1, wherein said active memory cell includes a control gate coupled to receive said positive voltage.

3. The method as recited in claim 1, wherein said positive voltage exceeds a turn-on voltage of said active memory cell.

4. The method as recited in claim 1, wherein said inactive memory cell includes a control gate coupled to receive said negative voltage.

5. The method as recited in claim 1, wherein said negative voltage is less than a turn-on voltage of said inactive memory cell.

6. The method as recited in claim 1, wherein said inactive memory cell includes a channel configured between a source and a drain region, a floating gate insulatively spaced above said channel, and a control gate insulatively spaced above said floating gate, wherein said control gate comprises a word line coupled to receive said negative voltage.

7. The method as recited in claim 6, wherein said floating gate is configured to receive negative charge during a program cycle, expel negative charge during an erase cycle and, over numerous program cycles and erase cycles, said floating gate is configured with a net positive charge corresponding to an over-erase condition.

8. The method as recited in claim 6, wherein said memory cell is configured with a depletion mode transistor.

9. The method as recited in claim 6, wherein said floating gate is intentionally provided a net positive charge such that said channel comprises a channel of a depletion mode transistor.

10. The method as recited in claim 9, wherein said over-erase condition causes a negative threshold voltage within said inactive memory cell.

11. A method for minimizing bit line leakage during a read cycle of a non-volatile memory array, comprising the steps of:

providing an array of single transistor programmable read only memory cells, each single transistor cell having a control gate coupled to a word line and a drain coupled to a bit line;

connecting a series of drains associated with respective single transistor cells to a bit line conductor;

connecting respective control gates associated with the bit line connected series of single transistor cells to respective word conductors; and applying a voltage exceeding turn-on threshold to one word conductor of said bit line connected series of single transistor cells while further applying a negative voltage below turn-on threshold to the others of said bit line connected series of single transistor cells.

12. The method as recited in claim 11, further comprising the steps of programming one of said single transistor programmable read only memory cells prior to said applying step.

13. The method as recited in claim 12, wherein said programming step comprises applying an electric field between said control gate and said drain to draw negative electrons upon a floating gate arranged therebetween.

14. The method as recited in claim 11, further comprising the steps of programming and erasing of said single transistor programmable read only memory cells prior to said applying step.

15. The method as recited in claim 14, wherein said programming step comprises applying negatively charged electrons upon a floating gate insulatively spaced between said control gate and said drain, and said erasing step comprises drawing negatively charged electrons from said floating gate exceeding those applied thereon, such that said electrons are drawn to said floating gate subsequent to said programming and erasing steps.

16. The method as recited in claim 14, wherein said negative voltage is less than turn on voltage of any single transistor programmable read only memory cell within said array of memory cells regardless of the number of previous programming and erasing steps.

17. A method for programming, erasing and reading a bit within an array of single transistor programmable read only memory cells, said method comprising the steps of:

providing a single transistor read only memory cell having a channel region arranged between a source and drain, and further having a floating gate insulatively spaced between said channel region and a control gate;

connecting a word line to said control gate and a bit line to said drain;

adding negative charge upon said floating gate by applying a first positive voltage to said control gate and a second positive voltage upon said drain;

removing negative charge from said floating gate by applying a ground voltage to said control gate and a third positive voltage upon said source;

programming negative charge upon said floating gate by applying a ground voltage to said control gate and a first negative voltage upon said source;

repeating said programming and erasing steps over time to cause a net positive charge upon said floating gate; and ensuring said single transistor is inactive during reading of bit line voltage of said respective drain by applying a negative voltage to the respective said control gate, whereby said negative voltage is of a negative voltage magnitude never to invert the channel region insulatively spaced beneath said net positively charged said floating gate.

18. The method as recited in claim 17, wherein said removing step comprises applying a first negative voltage to said control gate and a third positive voltage upon said drain.

19. The method as recited in claim 17, wherein said single transistor programmable memory cell comprises an EEPROM cell.

20. The method as recited in claim 17, wherein said single transistor programmable memory cell comprises an EPROM cell.

21. The method as recited in claim 17, wherein said single transistor programmable memory cell comprises a flash EPROM cell.

22. The method as recited in claim 17, wherein said word line is connected to a row decode unit.

23. The method as recited in claim 17, wherein said bit line is connected to a column decode unit.

* * * * *